US011961480B2

(12) United States Patent
Park

(10) Patent No.: US 11,961,480 B2
(45) Date of Patent: Apr. 16, 2024

(54) SCAN DRIVER AND ORGANIC LIGHT EMITTING DISPLAY APPARATUS INCLUDING THE SAME

(71) Applicant: LG DISPLAY CO., LTD., Seoul (KR)

(72) Inventor: Yong Seok Park, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 17/953,792

(22) Filed: Sep. 27, 2022

(65) Prior Publication Data
US 2023/0020231 A1 Jan. 19, 2023

Related U.S. Application Data

(63) Continuation of application No. 17/343,624, filed on Jun. 9, 2021, now Pat. No. 11,508,310.

(30) Foreign Application Priority Data

Sep. 11, 2020 (KR) .......... 10-2020-0116874

(51) Int. Cl.
G09G 3/3266 (2016.01)
H10K 59/121 (2023.01)

(52) U.S. Cl.
CPC ....... G09G 3/3266 (2013.01); H10K 59/1213 (2023.02)

(58) Field of Classification Search
CPC .. G11C 19/28; H01L 27/3262; G09G 3/3266; G09G 2310/08; G09G 2300/0426; G09G 2310/0286
See application file for complete search history.

(56) References Cited

U.S. PATENT DOCUMENTS

2006/0007085 A1  1/2006 Kim et al.
2011/0148853 A1  6/2011 Ko
(Continued)

FOREIGN PATENT DOCUMENTS

CN  102779478 A  11/2012
CN  105405417 A  3/2016
(Continued)

OTHER PUBLICATIONS

Chinese Office Action dated Dec. 27, 2023 issued in Patent Application No. 202110598138.6 w/English Translation (16 pages).

Primary Examiner — Shaheda A Abdin
(74) Attorney, Agent, or Firm — POLSINELLI PC

(57) ABSTRACT

A scan driver and an organic light emitting display apparatus including the same, where a narrow bezel is realized, are provided. The scan driver includes a plurality of stages, wherein each of the plurality of stages includes a Q1 node controller controlling a voltage of a Q1 node by using first and second clock signals whose phases are opposite to each other, a QB node controller controlling a voltage of a QB node by using the first and second clock signals, an output clock signal, and a start signal, a first transistor outputting a gate low voltage as a scan signal while the QB node is activated, and a second transistor outputting a gate high voltage as the scan signal while a Q2 node is activated, and outputting the gate low voltage as the scan signal when the Q2 node is bootstrapped to a voltage lower than the gate low voltage.

10 Claims, 11 Drawing Sheets

(56) References Cited

U.S. PATENT DOCUMENTS

| | | | |
|---|---|---|---|
| 2012/0176417 A1* | 7/2012 | Jang | G11C 19/184 345/77 |
| 2014/0093028 A1 | 4/2014 | Wu | |
| 2016/0071614 A1 | 3/2016 | Lee | |
| 2017/0116926 A1* | 4/2017 | Bong | G11C 19/28 |
| 2017/0372654 A1 | 12/2017 | So et al. | |
| 2018/0122318 A1* | 5/2018 | Cao | G09G 3/3677 |

FOREIGN PATENT DOCUMENTS

| | | |
|---|---|---|
| CN | 108831400 A | 11/2018 |
| CN | 109935210 A | 6/2019 |
| CN | 111326096 A | 6/2020 |
| WO | 2016-106847 A1 | 7/2016 |

* cited by examiner

SCAN DRIVER AND ORGANIC LIGHT EMITTING DISPLAY APPARATUS INCLUDING THE SAME

CROSS-REFERENCE TO RELATED APPLICATIONS

This application is a continuation of U.S. patent application Ser. No. 17/343,624, filed on Jun. 9, 2021, which claims the priority benefit of Korean Patent Application No. 10-2020-0116874, filed on Sep. 11, 2020, which are hereby incorporated by reference in their entirety for all purposes as if fully set forth herein.

BACKGROUND

Field of the Technology

The present disclosure relates to a scan driver and an organic light emitting display apparatus including the same, and particularly, to a scan driver and an organic light emitting display apparatus including the same, in which a narrow bezel is realized.

Discussion of the Related Art

Recently, representative examples of flat panel display apparatuses attracting much attention include liquid crystal display (LCD) apparatuses using liquid crystal, organic light emitting diode (OLED) display apparatuses using an OLED, and electrophoretic display (EPD) apparatuses using e-ink.

The flat panel display apparatuses include a display panel which includes a pixel array including a plurality of pixels independently driven by a thin film transistor (TFT) thereof and displays an image by using the pixel array, a scan driver which drives a plurality of scan lines of the display panel, a data driver which drives a plurality of data lines of the display panel, and a timing controller which controls the scan driver and the data driver.

The scan driver includes a plurality of stages which respectively and individually drive the scan lines of the display panel, and each of the plurality of stages is configured with a plurality of TFTs. Recently, the scan driver is mainly using a gate-in panel (GIP) type where a TFT array of the pixel array is implemented and embedded in the display panel.

In this case, due to an area occupied by the scan driver in the display panel, it is difficult to implement a narrow-bezel display apparatus.

SUMMARY

To overcome the aforementioned problem of the related art, the present disclosure may provide a scan driver and an organic light emitting display apparatus including the same, in which a narrow bezel is realized.

To achieve these objects and other advantages and in accordance with the purpose of the disclosure, as embodied and broadly described herein, a scan driver includes a plurality of stages, wherein each of the plurality of stages includes a Q1 node controller controlling a voltage of a Q1 node by using first and second clock signals whose phases are opposite to each other, a QB node controller controlling a voltage of a QB node by using the first and second clock signals, an output clock signal, and a start signal, a first transistor outputting a gate low voltage as a scan signal while the QB node is activated, and a second transistor outputting a gate high voltage as the scan signal while a Q2 node is activated, and outputting the gate low voltage as the scan signal when the Q2 node is bootstrapped to a voltage lower than the gate low voltage.

Moreover, each of the plurality of stages may further include a first capacitor connected between the second transistor and a clock output terminal thereof, and when the scan signal is transitioned from the gate high voltage to the gate low voltage, the first capacitor may bootstrap the Q2 node by reflecting a voltage variation of the output clock terminal to the Q2 node.

Moreover, the QB node controller may include a third transistor and a fourth transistor serially connected between the QB node and an input terminal corresponding to the start signal, a fifth transistor supplying the gate high voltage to a second capacitor according to the voltage of the Q1 node, and a sixth transistor supplying the first clock signal to the second capacitor according to the voltage of the Q1 node, wherein the third transistor may supply the start signal to the fourth transistor in response to the output clock signal, and the fourth transistor may supply the start signal to the QB node in response to the second clock signal.

Moreover, the Q1 node controller may include a seventh transistor supplying the second clock signal to the Q1 node according to the voltage of the QB node, an eighth transistor supplying the gate low voltage to the Q1 node according to the second clock signal, and a ninth transistor supplying the gate low voltage to the Q1 node according to the first clock signal.

Moreover, each of the plurality of stages may further include a tenth transistor disposed between the Q1 node and the Q2 node and an eleventh transistor disposed between the Q2 node and the third transistor, wherein the tenth transistor and the eleventh transistor may be turned off when the Q2 node is bootstrapped to a voltage lower than the gate low voltage.

In this case, the second capacitor is connected between the QB node and the sixth transistor, and when the scan signal maintains the gate low voltage, the second capacitor may bootstrap the QB node by reflecting a voltage variation of a drain of the sixth transistor to the QB node.

In another aspect of the present disclosure, an organic light emitting display apparatus includes a display panel, including a display area in which a pixel array is disposed and a non-display area disposed in at least one side of the display area, and the scan driver as above mentioned supplying a scan signal generated through each of the plurality of stages to a plurality of scan lines of the pixel array.

In this case, a plurality of transistors included in the scan driver may include a polycrystalline silicon transistor, and a plurality of transistors included in the pixel array may include an oxide semiconductor transistor.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE DISCLOSURE

Hereinafter, embodiments according to the present disclosure will be described in detail with reference to the accompanying drawings.

Figure 1:
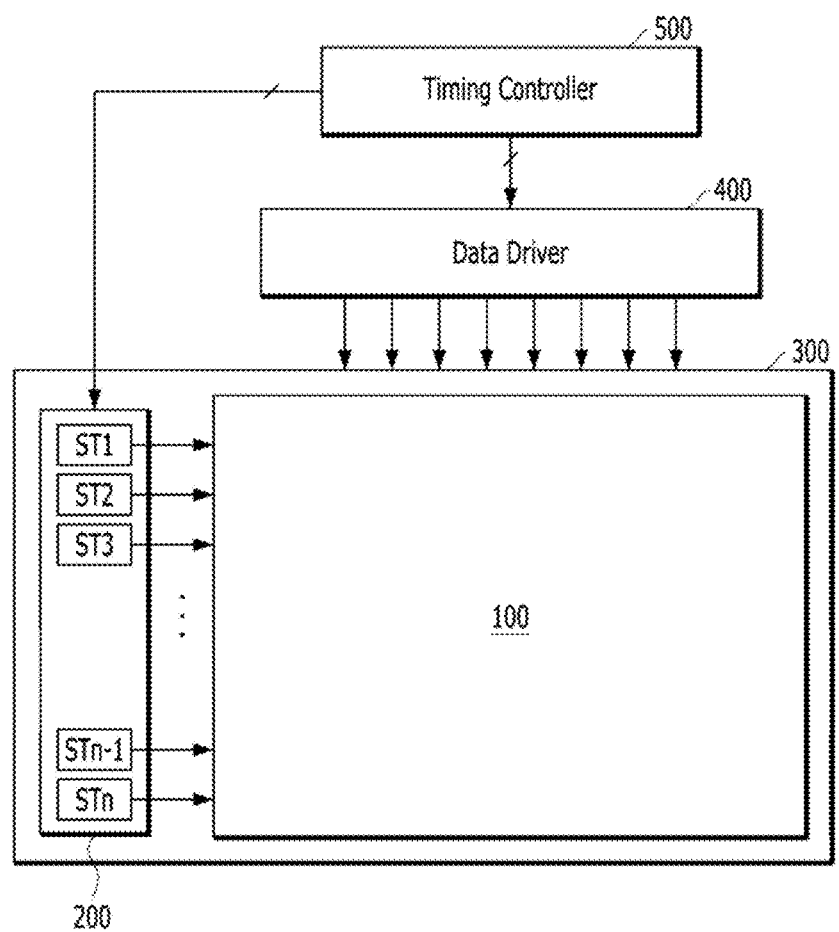
FIG. 1 is a block diagram illustrating a display apparatus according to the present disclosure.

FIG. 1 is a block diagram illustrating a display apparatus according to the present disclosure.

Referring to FIG. 1, the display apparatus according to the present disclosure may include a display panel 300 including a pixel array 100 and a scan driver 200, a data driver 400, and a timing controller 500.

The timing controller 500 may receive a basic timing control signal and video data supplied from a host system. The timing controller 500 may modulate the video data by using various data processing methods for compensating for image quality or decreasing power consumption and may output modulated image data to the data driver 400.

The timing controller 500 may generate a data control signal for controlling an operation timing of the data driver 400 by using the basic timing control signal to supply the data control signal to the data driver 400 and may generate a gate control signal for controlling an operation timing of the scan driver 200 by using the basic timing control signal to supply the gate control signal to the scan driver 200. The basic timing control signal may include a dot clock and a data enable signal and may further include a horizontal synchronization signal and a vertical synchronization signal. The data control signal may include a source start pulse and a source shift clock, which control a latch timing of image data in the data driver 400, and a source output enable signal which controls an output period of an image data signal. The gate control signal may include a gate start pulse for controlling an operating time of the scan driver 200 and gate clocks used as an output signal or a shift control signal.

A level shifter may be additionally provided between the timing controller 500 and the scan driver 200. The level shifter may be embedded into a power unit (not shown). The level shifter may level-shift the gate control signal (i.e., a gate start pulse and a transistor-transistor logic (TTL) of each clock) to a gate high voltage (a gate-on voltage) and a gate low voltage (a low level voltage or a gate-off voltage) for driving a transistor of the pixel array 100 and may supply the gate high voltage and the gate low voltage to the scan driver 200.

The data driver 400 may be supplied with the data control signal and the image data from the timing controller 500. The data driver 400 may be driven based on the data control signal and may subdivide a reference gamma voltage set, supplied from a gamma voltage generator, into grayscale voltages respectively corresponding to a grayscale values of data, convert digital image data into analog image data signals by using the grayscale voltages, and supply the analog image data signals to data lines of the display panel 300.

The data driver 400 may be configured with a plurality of data drive integrated circuits (ICs) for divisionally driving the data lines of the display panel 300, and each of the data drive ICs may be mounted on a circuit film such as a tape carrier package (TCP), a chip-on film (COF), or a flexible printed circuit (FPC) and may be attached on the display panel 300 on the basis of a tape automatic bonding (TAB) type or may be mounted on the display panel 300 by using a chip-on glass (COG) type.

The display panel 300 may display an image by using the pixel array 100 where a plurality of pixels are arranged as a matrix type. Each of the plurality of pixels of the pixel array 100 may implement a desired color on the basis of a combination of a red (R) subpixel, a green (G) subpixel, and a blue (B) subpixel and may further include a white subpixel for enhancing luminance.

Figure 2:
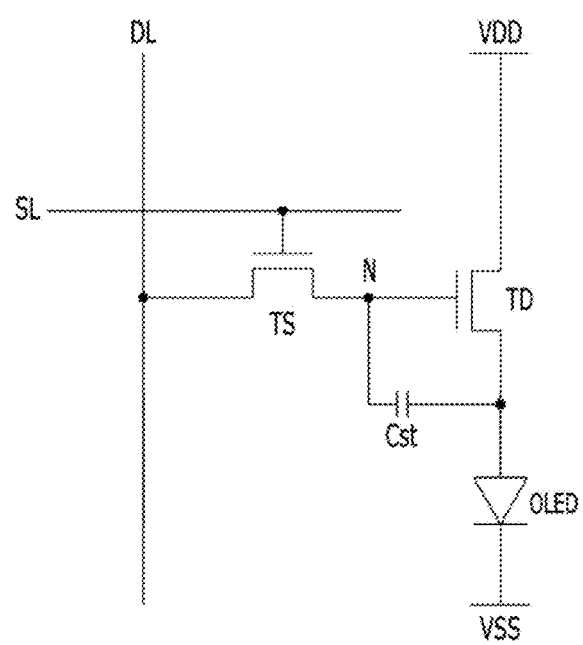
FIG. 2 is a circuit diagram illustrating a subpixel provided in a pixel array illustrated in FIG. 1.

Each of the subpixels, as illustrated in FIG. 2, may include a light emitting device OLED, a driving transistor TD, a switch transistor TS, and a storage capacitor Cst.

The light emitting device OLED may include an anode electrode connected to the driving transistor TD, a cathode electrode connected to an input terminal for a low level power VSS, and an organic compound layer disposed between the anode electrode and the cathode electrode. The driving transistor TD may control a driving current flowing in the light emitting device OLED on the basis of a voltage difference between a gate and a source thereof to allow the light emitting device OLED to emit light. The switch transistor TS may be turned on based on a scan signal supplied through a scan line SL and may apply a data voltage, charged into a data line DL, to a node N. The storage capacitor Cst may include a one-side electrode connected to the gate of the driving transistor TD through the node N and an other-side electrode connected to the source of the driving transistor TD. The storage capacitor Cst may maintain a gate-source voltage of the driving transistor TD while the light emitting device OLED is emitting light.

The scan driver 200 may be configured as a gate-in panel (GIP) type where the scan driver 200 is embedded into a non-display area of the display panel 300 (i.e., a non-display area adjacent to one side or both sides of the pixel array 100) and may be referred to as a GIP circuit. The scan driver 200 may include a plurality of stages ST1 to STn-1, STn (n is an integer greater than 1), for example, ST1 to ST4, . . . which respectively drive a plurality of scan lines SL1 to SL4, . . . of the pixel array 100 and are dependently connected to one another, and each of the stages ST may include a plurality of transistors which are formed on a substrate along with a transistor of the pixel array 100. A transistor included in the pixel array and each stage may be implemented as at least one of an oxide semiconductor transistor, a polycrystalline silicon transistor, and an amorphous silicon transistor. For example, a transistor of each subpixel may be implemented as an oxide semiconductor transistor which is good in off current characteristic, and a transistor included in the scan driver 200 may be implemented as a polycrystalline silicon transistor which is good in on current characteristic and reliability characteristic. However, this is merely an example, and a structure of a transistor is not limited thereto.

Figure 3:
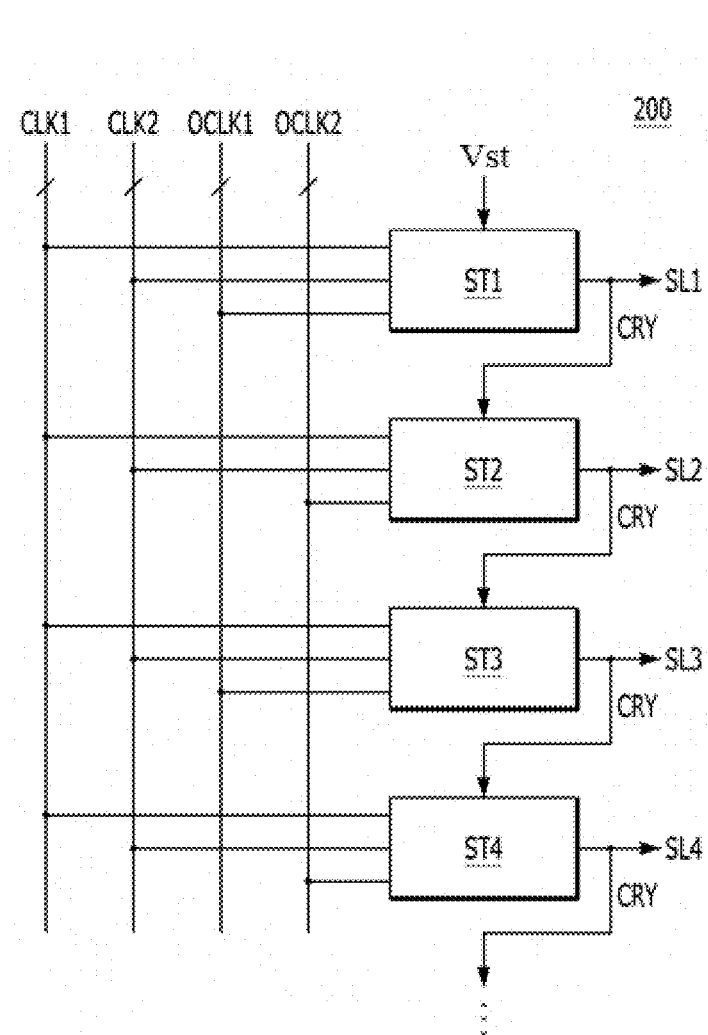
FIG. 3 is a diagram illustrating a configuration of a stage included in a scan driver illustrated in FIG. 1.

Operations of the stages ST1 to ST4, . . . , as illustrated in FIG. 3, may be sequentially activated based on a start signal and may output a scan signal to each of the scan lines SL1 to SL4, . . . . An operation of an uppermost stage ST1 may be activated based on an external start signal Vst, and operations of a second stage ST2 to a lowermost stage may be activated based on a scan signal of a previous stage. The scan signal of the previous stage may be an internal start signal and may be a carry signal CRY. Here, the previous stage may denote a stage which is disposed on a reference stage and generates a scan signal having a phase which leads compared to a scan signal output from the reference stage.

The stages ST1 to ST4, . . . may receive a start signal Vst, first and second clock signals CLK1 and CLK2, and first and second output clock signals OCLK1 and OCLK2 from the level shifter so as to output the scan signal SCAN. The start signal Vst, the first and second clock signals CLK1 and CLK2, and the first and second output clock signals OCLK1 and OCLK2 may all swing between a gate-off voltage VGH and a gate-on voltage VGL.

The external start signal Vst may be input to the uppermost stage ST1, the first and second clock signals CLK1 and CLK2 may be input to all of the stages ST1 to ST4, . . . , the first output clock signal OCLK1 may be input to odd-numbered stages ST1, ST3, . . . , and the second output clock signal OCLK2 may be input to even-numbered stages ST2, ST4, . . . .

The first and second output clock signals OCLK1 and OCLK2 may have opposite phases and may have a period corresponding to a two-horizontal period 2H.

The first and second clock signals CLK1 and CLK2 may have opposite phases and may have a period corresponding to a two-horizontal period 2H. A pulse width of a high level period of each of the first and second clock signals CLK1 and CLK2 may be greater than that of a low level period.

Each of the stages ST1 to ST4, . . . may activate an operation of a node Q on the basis of the start signal Vst applied to a start terminal at every frame. Here, the activation of a node may denote that the gate-on voltage VEL or a lower voltage than the gate-on voltage VEL is applied to a corresponding node. Also, the deactivation of a node may denote that the gate-off voltage VEH or a higher voltage than the gate-off voltage VEH is applied to a corresponding node.

Figure 4:
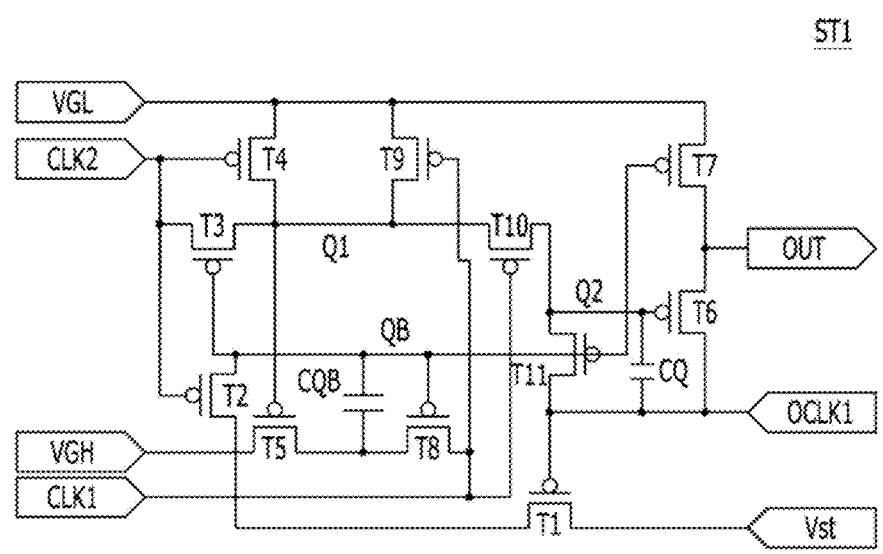
FIG. 4 is a circuit diagram illustrating an uppermost stage illustrated in FIG. 3.

FIG. 4 is a circuit diagram illustrating a first stage which is an uppermost stage ST1 included in a gate shifter register of FIG. 3.

Except for that odd stages ST3, ST5, . . . other than the uppermost stage ST1 are supplied with an internal start signal CRY instead of a start signal Vst and output a scan signal having a different phase, the other elements may be the same. Also, except for that even stages ST2, ST4, . . . are supplied with the internal start signal CRY instead of the start signal Vst, are supplied with a second output clock signal OCLK2 instead of a first output clock signal OCLK1, and output a scan signal having a different phase, the other elements may be the same.

The stage illustrated in FIG. 4 may include an output buffer unit, a stabilization unit, a QB node controller, a Q1 node controller, and first and second capacitors CQ and CQB.

The output buffer unit may include sixth and seventh transistors T6 and T7 and the first capacitor CQ. The sixth transistor T6 may be controlled by a node Q2 and may provide a current path between an output clock signal terminal OCLK1 and an output terminal OUT. When a voltage of the node Q2 is a gate low voltage VGL, the sixth transistor T6 may be turned on and may supply an output clock signal OCLK1 as a scan signal to the output terminal OUT. The seventh transistor T7 may be controlled by a node QB and may provide a current path between an input terminal corresponding to the gate low voltage VGL and the output terminal OUT. When a voltage of the node QB is the gate low voltage VGL, the seventh transistor T7 may be turned on and may supply the gate low voltage VGL as the scan signal to the output terminal OUT.

The first capacitor CQ may reflect a voltage variation of the output clock signal OCLK1 to a voltage of the node Q2, and may bootstrap the node Q2. When the node Q1 is floated due to the turn-off of a tenth transistor T10, the output clock signal OCLK1 corresponding to the gate low voltage VGL may be input, and thus, a voltage of the node Q2 may be bootstrapped to a first bootstrapping voltage Vb1 which is lower than the gate low voltage VGL, due to a coupling effect of the first capacitor CQ. As described above, when the first capacitor CQ bootstraps a voltage of the node Q2, the gate low voltage may be applied to the node Q2, and thus, the output delay of a scan signal which is the gate low voltage of a first output clock signal may be minimized.

The stabilization unit may include the tenth transistor T10 and an eleventh transistor T11, which are connected to the node Q2.

While a voltage of the node Q2 is bootstrapped, the tenth transistor T10 may be turned off and may cut off a current between the node Q1 and the node Q2. Although a voltage of the node Q2 is bootstrapped, an influence thereof may not be applied to third, fourth, and fifth transistors T3, T4, and T5 connected to the node Q1. Therefore, a drain-source voltage of each of the third, fourth, and fifth transistors T3, T4, and T5 may be prevented from increasing based on a bootstrapping voltage of the node Q2. That is, when the node Q2 is bootstrapped, the drain-source voltage of each of the third, fourth, and fifth transistors T3, T4, and T5 may be prevented from increasing to a threshold voltage or more, and thus, the occurrence of an element breakdown phenomenon caused by an overload may be prevented.

While a voltage of the node Q2 is bootstrapped, the eleventh transistor T11 may be turned off and may cut off a current between the node Q2 and the first transistor T1. Although a voltage of the node Q2 is bootstrapped, an influence thereof may not be applied to the first transistor T1.

The QB node controller may include the first transistor T1, a second transistor T2, the fifth transistor T5, an eighth transistor T8, and the capacitor CQB, which control a voltage of the node QB of the output buffer unit.

The first transistor T1 may be controlled by the first output clock signal OCLK1 and may provide a current path between a start signal terminal and the second transistor T2. In response to a gate low voltage of the first output clock signal OCLK1, the first transistor T1 may transfer the start signal Vst to the second transistor T2. The second transistor T2 may be controlled by the second clock signal CLK2 and may provide a current path between the node QB and the first transistor T1. In response to a gate low voltage of the second clock signal CLK2, the second transistor T2 may transfer a gate low voltage of the start signal Vst, transferred from the first transistor T1, to the node QB. The fifth transistor T5 may be controlled by a voltage of the node Q1 and may provide a current path between an input terminal corresponding to the gate high voltage VGH and the second capacitor CQB. The eighth transistor T8 may be controlled by a voltage of the node QB and may provide a current path between an input terminal corresponding to a first clock signal CLK1 and the second capacitor CQB.

The second capacitor CQB may reflect a voltage variation of the first clock signal CLK1 (or a drain of the eighth transistor T8) to a voltage of the node QB to bootstrap the node QB. When the node QB is floated due to the turn-off of the second transistor T2 and the first clock signal CLK1 having the gate low voltage is input, a voltage of the node QB may be bootstrapped to a second bootstrapping voltage Vb2 which is lower than the gate low voltage VGL, due to a coupling effect of the second capacitor CQB.

The Q1 node controller may include the third transistor T3, the fourth transistor T4, and a ninth transistor T9, which control a voltage of the node Q1.

The third transistor T3 may be controlled by the node QB and may provide a current path between an input terminal corresponding to the second clock signal CLK2 and the node Q1. In response to a gate low voltage of the node QB, the third transistor T3 may transfer a gate low voltage or a gate high voltage of the second clock signal CLK2 to the node Q1.

The fourth transistor T4 may be controlled by the second clock signal CLK2 and may provide a current path between an input terminal corresponding to the gate low voltage VGL and the node Q1. In response to the second clock signal CLK2 having a gate low voltage, the fourth transistor T4 may transfer the gate low voltage VGL to the node Q1.

The ninth transistor T9 may be controlled by the first clock signal CLK1 and may provide a current path between an input terminal corresponding to the gate low voltage VGL and the node Q1. In response to the first clock signal CLK1 having a gate low voltage, the ninth transistor T9 may transfer the gate low voltage VGL to the node Q1.

FIGS. 5A to 5F are diagrams for describing operations performed during first to sixth periods of a first stage which is an uppermost stage according to the present disclosure. As shown in FIGS. 5A to 5F, a falling edge of the first clock signal CLK1 is synchronized with a rising edge of the first output clock signal OCLK1 or a falling edge of the second output clock signal OCLK2. Also, a falling edge of the second clock signal CLK2 is synchronized with a falling edge of the first output clock signal OCLK1 or a rising edge of the second output clock signal OCLK2.

Figure 5A:
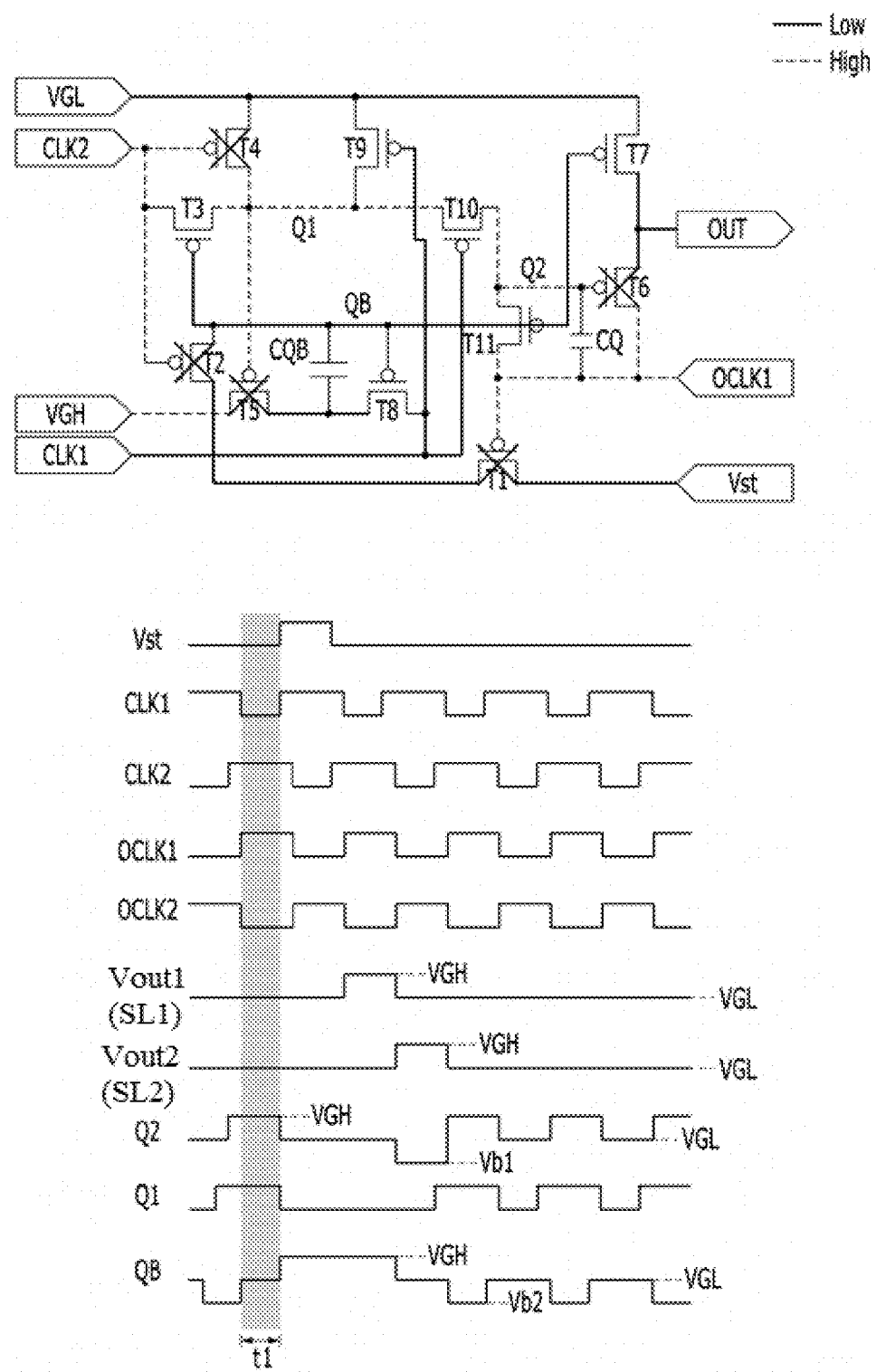
FIGS. 5A to 5F are diagrams for describing operations performed during first to sixth periods of a first stage which is an uppermost stage according to the present disclosure.

During a first period t1 illustrated in FIG. 5A, the start signal Vst having the gate low voltage, the first clock signal CLK1 having the gate low voltage, the second clock signal CLK2 having the gate high voltage, and the first output clock signal OCLK1 having the gate high voltage may be applied to the first stage ST1. At this time, the first output clock signal OCLK1 having the gate high voltage may be applied to an output clock terminal of each of the odd-numbered stages ST3, ST5, . . . other than the first stage ST1, and the second output clock signal OCLK2 having the gate low voltage may be applied to an output clock terminal of each of the even-numbered stages ST2, ST4, . . . .

The first transistor T1 may be turned off in response to the first output clock signal OCLK1 having the gate high voltage, the second and fourth transistors T2 and T4 may be turned off in response to the second clock signal CLK2 having the gate high voltage, and the ninth and tenth transistors T9 and T10 may be turned on in response to the first clock signal CLK1 having the gate low voltage.

The node QB may be floated based on the turn-off of the first and second transistors T1 and T2. At this time, a voltage of the node QB may be stabilized by the second capacitor CQB coupled to the eighth transistor T8, and thus, a voltage of the node QB may be activated to the gate low voltage VGL. In response to a voltage of the node QB, the third, seventh, eighth, and eleventh transistors T3, T7, T8, and T11 may be turned on.

The node Q1 may be supplied with the second clock signal CLK2 having the gate high voltage through the turned-on third transistor T3 and may be supplied with the gate low voltage VGL through the turned-on ninth transistor T9. At this time, the second clock signal CLK2 having the gate high voltage may have a value which is far greater than the gate low voltage VGL, and thus, the node Q1 may be supplied with the second clock signal CLK2 having the gate high voltage and thus may be deactivated to the gate high voltage.

The node Q2 may be deactivated to the gate high voltage on the basis of the second clock signal CLK2 applied through the tenth transistor T10. In response to a voltage of the node Q2, the sixth transistor T6 may be turned off.

Therefore, in the first period t1, the scan signal having the gate low voltage VGL may be output to the output terminal OUT through the turned-on seventh transistor T7.

Figure 5B:
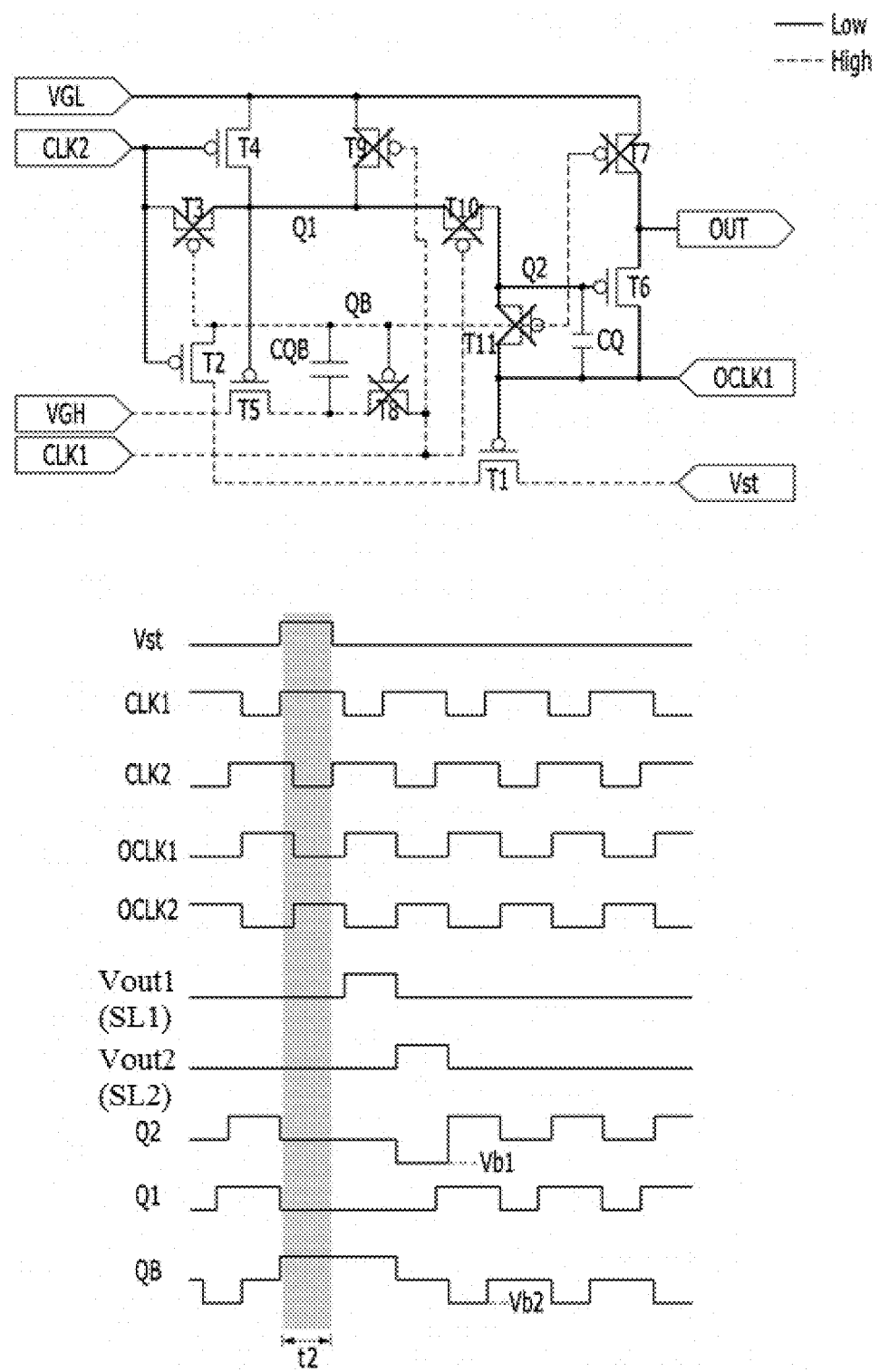

During a second period t2 illustrated in FIG. 5B, the start signal Vst having the gate high voltage, the first clock signal CLK1 having the gate high voltage, the second clock signal CLK2 having the gate low voltage, and the first output clock signal OCLK1 having the gate low voltage may be applied to the first stage ST1. At this time, the first output clock signal OCLK1 having the gate low voltage may be applied to the output clock terminal of each of the odd-numbered stages ST3, ST5, . . . other than the first stage ST1, and the second output clock signal OCLK2 having the gate high voltage may be applied to the output clock terminal of each of the even-numbered stages ST2, ST4, . . . .

The first transistor T1 may be turned on in response to the first output clock signal OCLK1 having the gate low voltage, the second and fourth transistors T2 and T4 may be turned on in response to the second clock signal CLK2 having the gate low voltage, and the ninth and tenth transistors T9 and T10 may be turned off in response to the first clock signal CLK1 having the gate high voltage.

The node QB may be deactivated to the start signal Vst having the gate high voltage through the turned-on first and second transistors T1 and T2. The third, seventh, eighth, and eleventh transistors T3, T7, T8, and T11 may be turned off based on the start signal Vst having the gate high voltage applied to the node QB.

The node Q1 may be activated based on the gate low voltage VGL applied through the turned-on fourth transistor T4.

The node Q2 may be floated by the turned-off tenth transistor T10. At this time, the node Q2 may be activated to the output clock signal OCLK1 having the gate low voltage by using the first capacitor CQ, and thus, the sixth transistor T6 may be turned on.

Therefore, in the second period t2, the gate low voltage VGL may be output as the scan signal to the output terminal OUT through the turned-on sixth transistor T6.

Figure 5C:
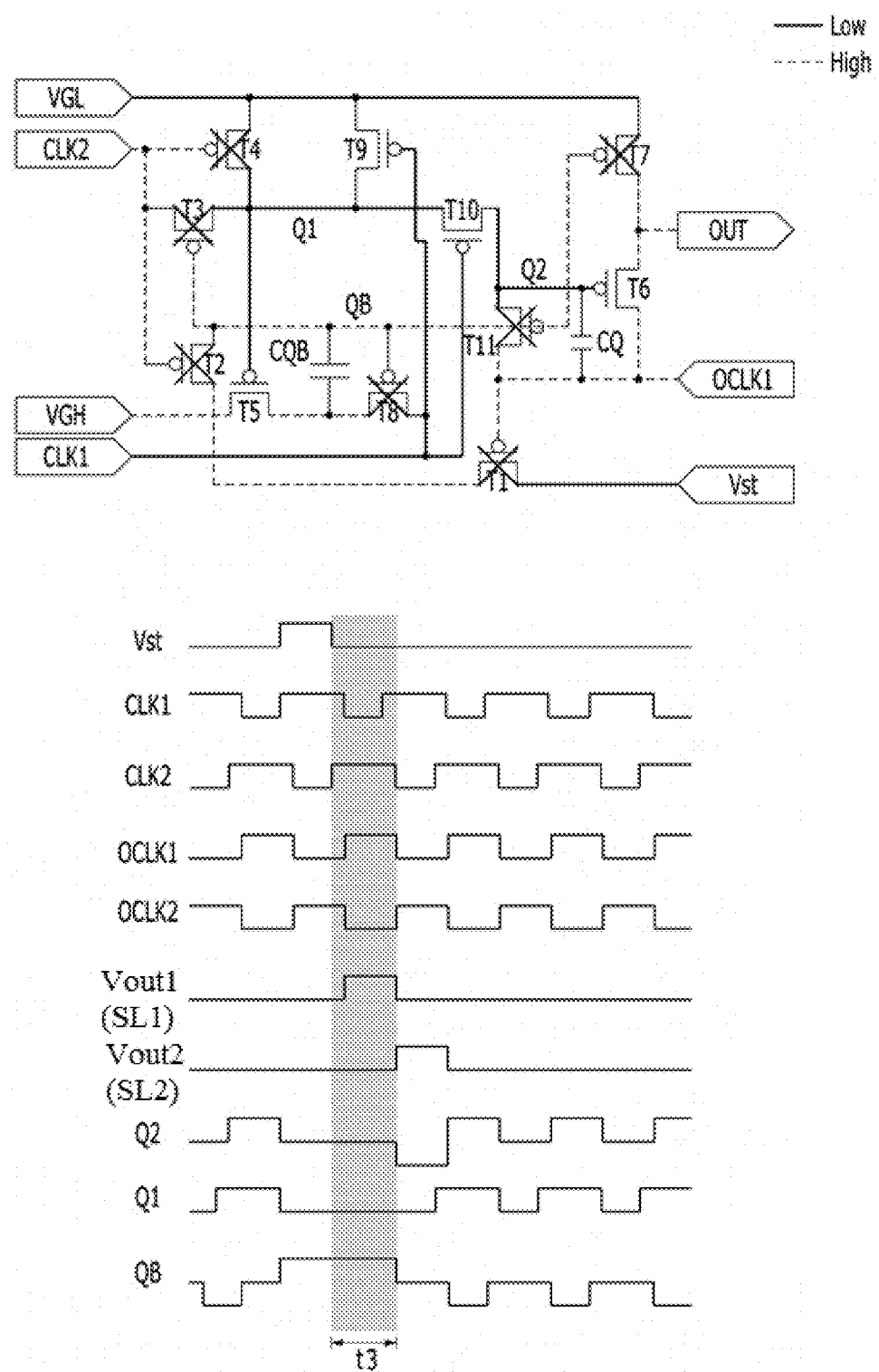

During a third period t3 illustrated in FIG. 5C, the start signal Vst having the gate low voltage, the first clock signal CLK1 having the gate low voltage, the second clock signal CLK2 having the gate high voltage, and the first output clock signal OCLK1 having the gate high voltage may be applied to the first stage ST1. At this time, the first output clock signal OCLK1 having the gate high voltage may be applied to the output clock terminal of each of the odd-numbered stages ST3, ST5, . . . other than the first stage ST1, and the second output clock signal OCLK2 having the gate low voltage may be applied to the output clock terminal of each of the even-numbered stages ST2, ST4, . . . .

The first transistor T1 may be turned off in response to the first output clock signal OCLK1 having the gate high voltage, the second and fourth transistors T2 and T4 may be turned off in response to the second clock signal CLK2 having the gate high voltage, and the ninth and tenth transistors T9 and T10 may be turned on in response to the first clock signal CLK1 having the gate low voltage.

The node QB may be floated by the turned-off second transistor T2 and may maintain the gate high voltage VGH of the second period t2 which is a previous period, and thus, may be deactivated to the gate high voltage. In response to the gate high voltage VGH of the node QB, the third, seventh, eighth, and eleventh transistors T3, T7, T8, and T11 may be turned off.

The node Q1 may be floated by the turned-off third and fourth transistors T3 and 4 and may maintain the gate low voltage VGL of the second period t2 which is a previous period, and thus, may be activated to the gate low voltage.

The node Q2 may be connected to the node Q1 through the tenth transistor T10, and thus, may be activated to the gate low voltage VGL. The sixth transistor T6 may be turned on by the gate low voltage VGL of the node Q2.

Therefore, in the third period t3, the gate high voltage VGH may be output as the scan signal to the output terminal OUT through the turned-on sixth transistor T6.

Figure 5D:
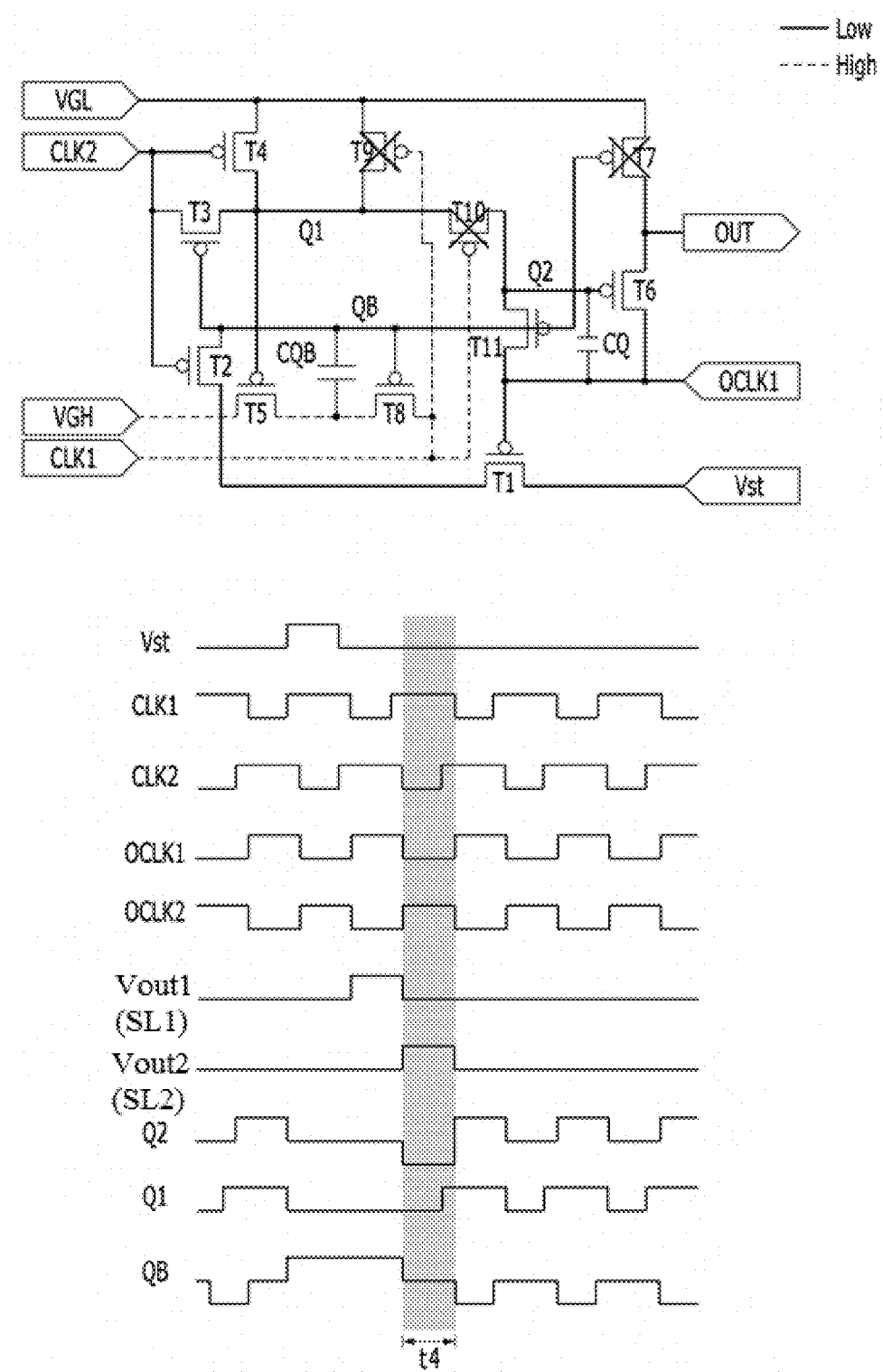

During a fourth period t4 illustrated in FIG. 5D, the start signal Vst having the gate low voltage, the first clock signal CLK1 having the gate high voltage, the second clock signal CLK2 having the gate low voltage, and the first output clock signal OCLK1 having the gate low voltage may be applied to the first stage ST1. At this time, the first output clock signal OCLK1 having the gate low voltage may be applied to the output clock terminal of each of the odd-numbered stages ST3, ST5, . . . other than the first stage ST1, and the second output clock signal OCLK2 having the gate high voltage may be applied to the output clock terminal of each of the even-numbered stages ST2, ST4, . . . .

The first transistor T1 may be turned on in response to the first output clock signal OCLK1 having the gate low voltage, the second and fourth transistors T2 and T4 may be turned on in response to the second clock signal CLK2 having the gate low voltage, and the ninth and tenth transistors T9 and T10 may be turned off in response to the first clock signal CLK1 having the gate high voltage.

The node QB may be activated to the start signal Vst having the gate low voltage through the turned-on first and second transistors T1 and T2. The eighth transistor T8 may be turned on by the start signal Vst having the gate low voltage applied to the node QB. At this time, because the second clock signal CLK2 having the gate high voltage is applied to a source of the third transistor T3 during the third period t3 previous thereto, when the second clock signal CLK2 having the gate low voltage is applied in the fourth period t4, the third transistor T3 may maintain a turn-on state until a gate-source voltage Vgs of the third transistor T3 is 0 V, and when the gate-source voltage Vgs of the third transistor T3 is 0 V, the third transistor T3 may be put in a turn-off state. Because the first output clock signal OCLK1 having the gate high voltage is applied to a source of the eleventh transistor T11 during the third period t3 previous thereto, when the first clock signal CLK1 having the gate high voltage is applied in the fourth period t4, the eleventh transistor T11 may maintain a turn-on state until a gate-source voltage Vgs of the eleventh transistor T11 is 0 V, and when the gate-source voltage Vgs of the eleventh transistor T11 is 0 V, the eleventh transistor T11 may be put in a turn-off state. Because the gate low voltage VGL is applied to a source of the seventh transistor T7 through an input terminal corresponding to the gate low voltage during the third period t3 previous thereto, a gate-source voltage Vgs of the seventh transistor T7 may be 0 V (Vgs=0V) in the fourth period t4, and thus, the seventh transistor T7 may be turned off.

The node Q1 may be activated based on the gate low voltage VGL applied through the turned-on fourth transistor T4.

The node Q2 may be floated by the turned-off tenth transistor T10. At this time, the node Q2 may be bootstrapped to the first bootstrapping voltage Vb1 which is lower than the gate low voltage of the first output clock signal OCLK1, on the basis of the first capacitor CQ. That is, the first capacitor may lower the gate low voltage to the first bootstrapping voltage Vb1 in a period where the sixth transistor T6 is turned on, and thus, the sixth transistor T6 connected to the node Q2 may be stably turned on.

Therefore, in the fourth period t4, the gate low voltage VGL of the first output clock signal OCLK1 may be output as the scan signal to the output terminal OUT through the turned-on sixth transistor T6.

As described above, a scan signal Vout1 having the gate low voltage is supplied to a first scan line SL1, and then, when the first output clock signal OCLK1 having a first gate low voltage is input, a voltage of the node Q2 may be bootstrapped in a period where the scan signal having the gate low voltage is supplied. A gate-source voltage of the sixth transistor T6 may increase through a bootstrapping operation, the gate low voltage VGL which is an output voltage of the scan signal may be stably output.

Figure 5E:
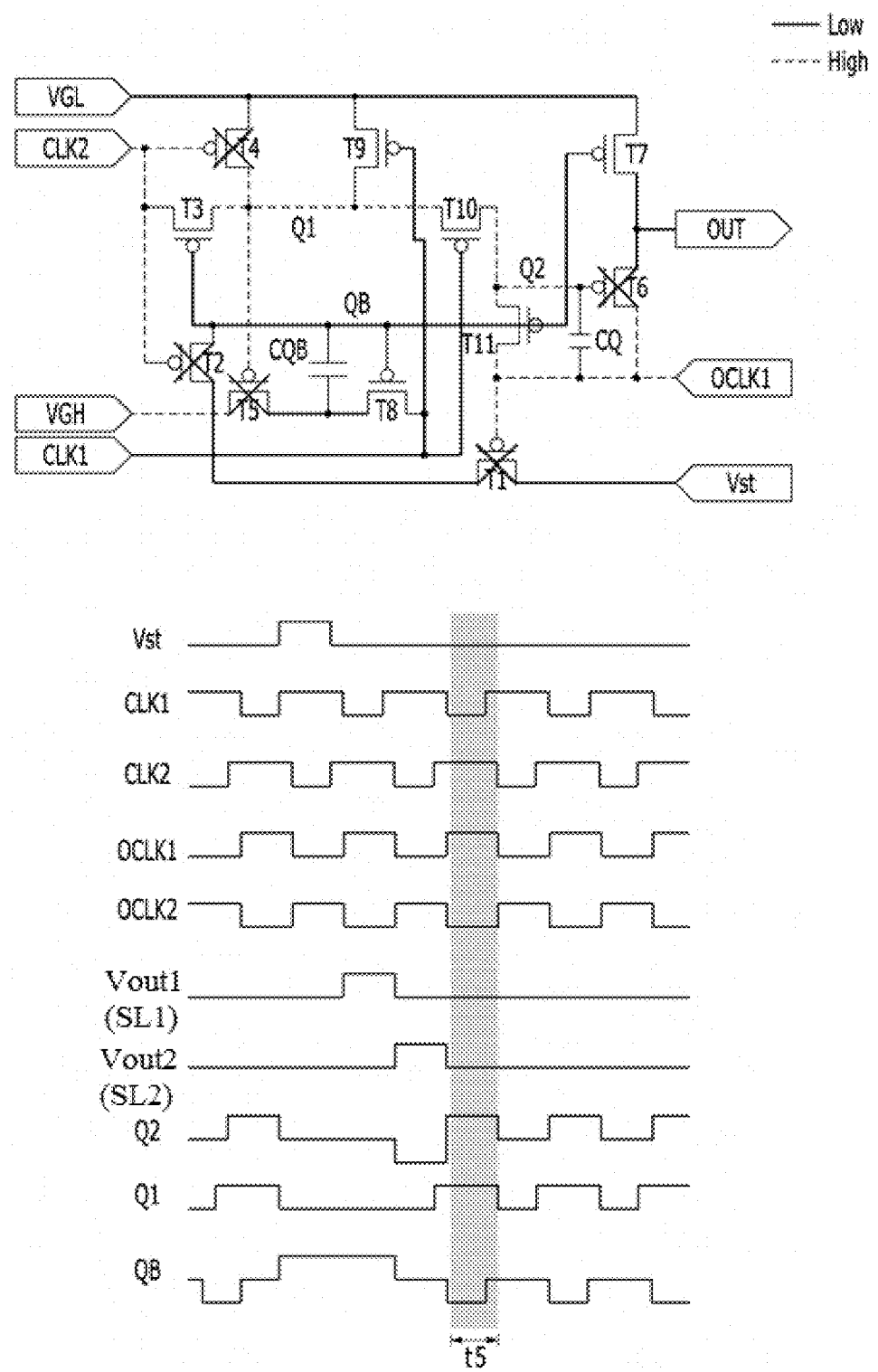

During a fifth fourth period t5 illustrated in FIG. 5E, the start signal Vst having the gate low voltage, the first clock signal CLK1 having the gate low voltage, the second clock signal CLK2 having the gate high voltage, and the first output clock signal OCLK1 having the gate high voltage may be applied to the first stage ST1. At this time, the first output clock signal OCLK1 having the gate high voltage may be applied to the output clock terminal of each of the odd-numbered stages ST3, ST5, . . . other than the first stage ST1, and the second output clock signal OCLK2 having the gate low voltage may be applied to the output clock terminal of each of the even-numbered stages ST2, ST4, . . . .

The first transistor T1 may be turned off in response to the first output clock signal OCLK1 having the gate high voltage, the second and fourth transistors T2 and T4 may be turned off in response to the second clock signal CLK2 having the gate high voltage, and the ninth and tenth transistors T9 and T10 may be turned on in response to the first clock signal CLK1 having the gate low voltage.

The node QB may be floated through the turned-off first and second transistors T1 and T2. At this time, the node QB may be bootstrapped to the second bootstrapping voltage Vb2 which is lower than the gate low voltage of the first clock signal CLK1, on the basis of the second capacitor CQB. That is, the second capacitor CQB may lower the gate low voltage VGL to the second bootstrapping voltage Vb2 in a period where the seventh transistor T7 is turned on, and thus, the seventh transistor T7 connected to the node QB may be stably turned on.

The node Q1 may be supplied with the second clock signal CLK2 having a high level through the turned-on third transistor T3 and may be supplied with the gate low voltage VGL through the turned-on ninth transistor T9. At this time, the second clock signal CLK2 having a high level may have a value which is far greater than the gate low voltage VGL, and thus, the node Q1 may be supplied with the second clock signal CLK2 having a high level and thus may be deactivated to the gate high voltage.

The node Q2 may be deactivated to the gate high voltage on the basis of the second clock signal CLK2 applied through the tenth transistor T10. In response to a voltage of the node Q2, the sixth transistor T6 may be turned off.

Therefore, in the fifth period t5, the scan signal having the gate low voltage VGL may be output to the output terminal OUT through the seventh transistor T7.

As described above, during the fifth period t5, a gate-source voltage of the seventh transistor T7 may increase through a second bootstrapping operation by using the second capacitor CQB, and thus, an output voltage of the scan signal may maintain a level of the gate low voltage.

Figure 5F:
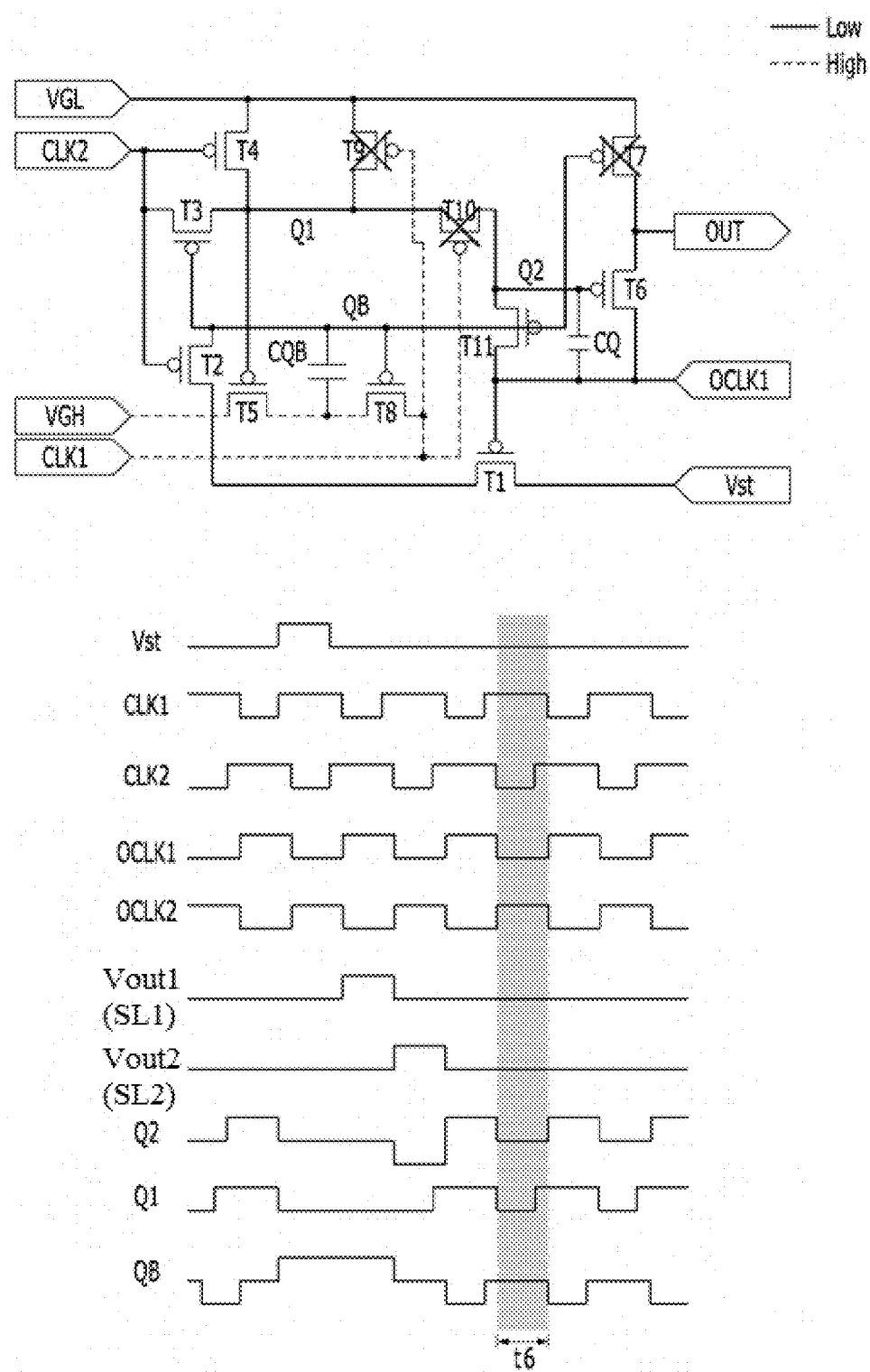

During a sixth period t6 illustrated in FIG. 5F, the start signal Vst having the gate low voltage, the first clock signal CLK1 having the gate high voltage, the second clock signal CLK2 having the gate low voltage, and the first output clock signal OCLK1 having the gate low voltage may be applied to the first stage ST1. At this time, the first output clock signal OCLK1 having the gate low voltage may be applied to the output clock terminal of each of the odd-numbered stages ST3, ST5, ... other than the first stage ST1, and the second output clock signal OCLK2 having the gate high voltage may be applied to the output clock terminal of each of the even-numbered stages ST2, ST4, ....

The first transistor T1 may be turned on in response to the first output clock signal OCLK1 having the gate low voltage, the second and fourth transistors T2 and T4 may be turned on in response to the second clock signal CLK2 having the gate low voltage, and the ninth and tenth transistors T9 and T10 may be turned off in response to the first clock signal CLK1 having the gate high voltage.

The node QB may be activated to the start signal Vst having the gate low voltage through the turned-on first and second transistors T1 and T2. The eighth transistor T8 may be turned on by the start signal Vst having the gate low voltage applied to the node QB. At this time, because the second clock signal CLK2 having the gate high voltage is applied to a source of the third transistor T3 during the fifth period t5 previous thereto, when the second clock signal CLK2 having the gate low voltage is applied in the sixth period t6, the third transistor T3 may maintain a turn-on state until the gate-source voltage Vgs of the third transistor T3 is 0 V, and when the gate-source voltage Vgs of the third transistor T3 is 0 V, the third transistor T3 may be put in a turn-off state. Because the first output clock signal OCLK1 having the gate high voltage is applied to a source of the eleventh transistor T11 during the fifth period t5 previous thereto, when the first clock signal CLK1 having the gate high voltage is applied in the sixth period t6, the eleventh transistor T11 may maintain a turn-on state until the gate-source voltage Vgs of the eleventh transistor T11 is 0 V, and when the gate-source voltage Vgs of the eleventh transistor T11 is 0 V, the eleventh transistor T11 may be put in a turn-off state. Because the gate low voltage VGL is applied to the source of the seventh transistor T7 through an input terminal corresponding to the gate low voltage during the fifth period t5 previous thereto, the gate-source voltage Vgs of the seventh transistor T7 may be 0 V (Vgs=0V) in the sixth period t6, and thus, the seventh transistor T7 may be turned off.

The node Q1 may be activated based on the gate low voltage VGL applied through the turned-on fourth transistor T4.

The node Q2 may be floated by the turned-off tenth transistor T10. At this time, the node Q2 may be activated to the first output clock signal OCLK1 having the gate low voltage by using the first capacitor CQ.

Therefore, in the sixth period t6, the gate low voltage VGL of the first output clock signal OCLK1 may be output as the scan signal to the output terminal OUT through the turned-on sixth transistor T6.

Figure 6:
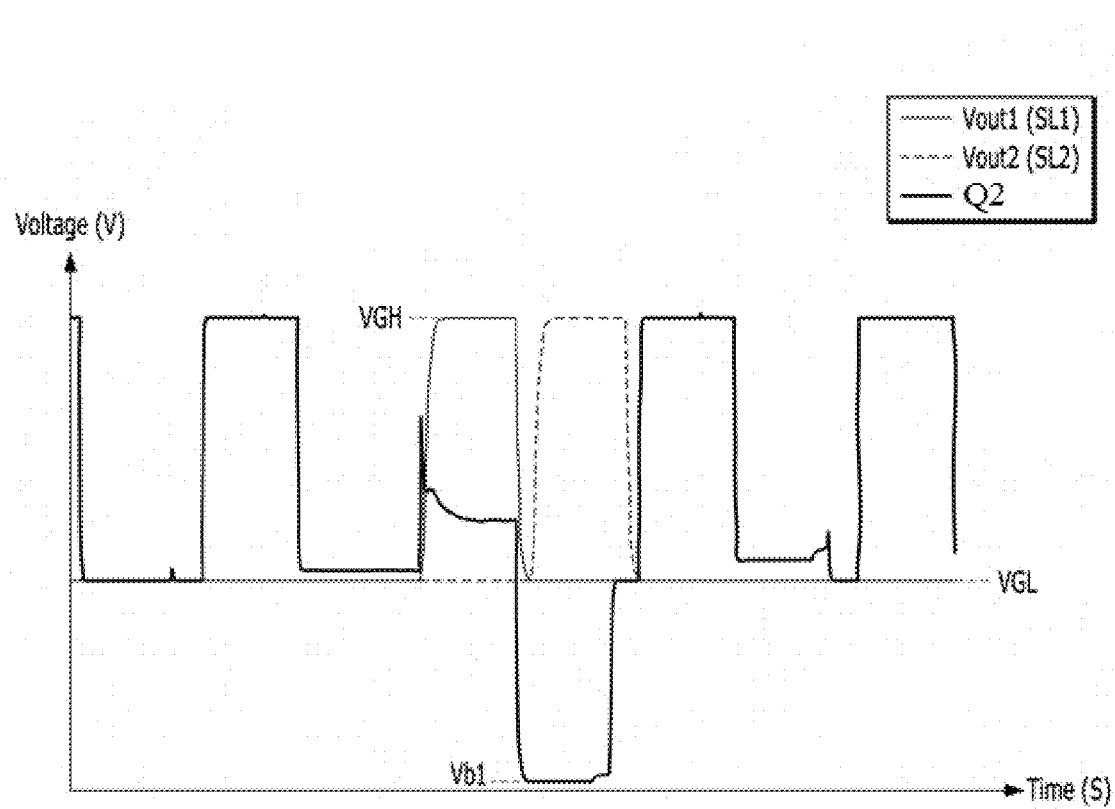
FIG. 6 is a graph showing a voltage applied to a node Q of a first stage which is an uppermost stage according to the present disclosure.

FIG. 6 is a graph showing a voltage applied to a node Q2 of a first stage ST1 which is an uppermost stage according to the present disclosure.

As shown in FIG. 6, it may be seen that a scan signal Vout1 having a gate high voltage VGH is supplied to a first scan line SL1, and then, based on a bootstrapping phenomenon using an output clock signal OCLK, a voltage of a node Q2 is a first bootstrapping voltage Vb1 which is lower than a gate low voltage VGL. Accordingly, a problem may be solved where a sixth transistor T6 is not turned on or the turn-on thereof is delayed, and thus, a falling time of a scan signal may be improved, thereby preventing the output delay of the gate low voltage VGL.

As described above, in the embodiments of the present disclosure, a falling time of the scan signal shifted from the gate high voltage to the gate low voltage may be improved to 1 µs or less through a first bootstrapping operation using a first capacitor CQ.

Moreover, according to the embodiments of the present disclosure, each stage ST of the scan driver 200 may be configured with eleven transistors T1 to T11 and two capacitors CQ and CQB, and thus, a circuit configuration may be simplified. Accordingly, an area occupied by each stage ST in the display panel 300 may be reduced, and thus, a line width of a bezel area may decrease by a minimum of 100 µm.

Moreover, comparing with a comparative example which includes more transistors than the number of transistors included in each stage according to the embodiments of the present disclosure, the transistors included in each stage according to the embodiments of the present disclosure may secure a threshold voltage margin which is similar to that of each of the transistors included in the stage of the comparative example.

Moreover, according to the embodiments of the present disclosure, scan signals supplied to scan lines may be shifted and output at a frequency of about 1 Hz without overlapping, and thus, driving may be performed at a low frequency for each scan line.

Moreover, according to the embodiments of the present disclosure, a node QB may be periodically activated by a bootstrapping operation based on the second capacitor CQB, and thus, the gate low voltage may be stably maintained in driving performed at a low frequency.

In the present disclosure, an organic light emitting display apparatus has been described as an example, but is not limited thereto and the present disclosure may be applied to electronic devices including a scan line.

As described above, according to the embodiments of the present disclosure, each of a plurality of stages of a scan driver may be configured with eleven transistors and two capacitors, and thus, a circuit configuration may be simplified. Accordingly, an area occupied by each stage in a display panel may be reduced, and thus, a line width of a bezel area may decrease by a minimum of 100 µm.

Moreover, according to the embodiments of the present disclosure, scan signals supplied to scan lines may be shifted and output at a frequency of about 1 Hz without overlapping, and thus, driving may be performed at a low frequency for each scan line.

Moreover, according to the embodiments of the present disclosure, a falling time of a scan signal shifted from a gate high voltage to a gate low voltage may be improved by a first bootstrapping operation based on a first capacitor.

Moreover, according to the embodiments of the present disclosure, a node may be periodically activated by a second bootstrapping operation based on a second capacitor, and thus, the gate low voltage may be stably maintained in driving performed at a low frequency.

The effects according to the present disclosure are not limited to the above examples, and other various effects may be included in the specification.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A scan driver comprising:
a plurality of stages,
wherein each of the plurality of stages comprises:
a first node controller controlling a voltage of a first node by using first and second clock signals;
a second node controller controlling a voltage of a second node by using the first and second clock signals, an output clock signal, and a start signal;
an output buffer unit including a first transistor and a second transistor; and
a third node directly connecting to the first node through a tenth transistor,
wherein the first transistor outputs a gate low voltage as a scan signal while the second node is activated,
the second transistor outputs a gate high voltage of the output clock signal as the scan signal while the third node is activated, and
wherein a rising edge or a falling edge of the output clock signal is synchronized with a falling edge of the first clock signal or a falling edge of the second clock signal.

2. The scan driver of claim 1, wherein the second node controller comprises:
a third transistor and a fourth transistor serially connected between the second node and an input terminal corresponding to the start signal;
a fifth transistor supplying the gate high voltage to a capacitor according to the voltage of the first node; and
a sixth transistor supplying the first clock signal to the capacitor according to the voltage of the second node,
wherein the third transistor supplies the start signal to the fourth transistor in response to the output clock signal, and
wherein the fourth transistor supplies the start signal to the second node in response to the second clock signal.

3. The scan driver of claim 1, wherein the first node controller comprises:
a seventh transistor supplying the second clock signal to the first node according to the voltage of the second node; and
an eighth transistor supplying the gate low voltage to the first node according to the first and second clock signals.

4. The scan driver of claim 1, wherein the tenth transistor is controlled by the first clock signal.

5. The scan driver of claim 4, wherein each of the plurality of stages further comprises a ninth transistor supplying the output clock signal to the third node according to the voltage of the second node.

6. The scan driver of claim 4, wherein the capacitor is connected between the second node and the sixth transistor, and
when the scan signal maintains the gate low voltage, the capacitor bootstraps the second node by reflecting a voltage variation of a drain of the sixth transistor to the second node.

7. The scan driver of claim 1, wherein the output clock signal has a same phase as the second clock signal and has a different pulse width from the second clock signal.

8. The scan driver of claim 1, wherein the plurality of stages include odd-numbered stages and even-numbered stages, and
wherein a waveform of the output clock signal input to the odd-numbered stages and a waveform of the output clock signal input to the even-numbered stages are inverted.

9. An organic light emitting display apparatus comprising:
a display panel including a display area in which a pixel array is disposed and a non-display area disposed in at least one side of the display area; and
a plurality of stages,
wherein each of the plurality of stages comprises:
a first node controller controlling a voltage of a first node by using first and second clock signals;
a second node controller controlling a voltage of a second node by using the first and second clock signals, an output clock signal, and a start signal;
a third node directly connecting to the first node through a tenth transistor; and
an output buffer unit including a first transistor and a second transistor,
wherein the first transistor outputs a gate low voltage as a scan signal while the second node is activated, and the second transistor outputs the output clock signal as the scan signal while the third node is activated,
wherein the scan driver supplies a scan signal generated through each of the plurality of stages to a plurality of scan lines of the pixel array, and
wherein a rising edge or a falling edge of the output clock signal is synchronized with a falling edge of the first clock signal or a falling edge of the second clock signal.

10. The organic light emitting display apparatus of claim 9, wherein the plurality of transistors included in the scan driver have a polycrystalline silicon transistor, and
wherein the pixel array includes a plurality of transistors, and the plurality of transistors included in the pixel array have an oxide semiconductor transistor.

* * * * *